(12) United States Patent
Hada

(10) Patent No.: US 6,200,710 B1
(45) Date of Patent: Mar. 13, 2001

(54) METHODS FOR PRODUCING SEGMENTED RETICLES

(75) Inventor: Kazunari Hada, Ichihara (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/272,930

(22) Filed: Mar. 18, 1999

(30) Foreign Application Priority Data

Mar. 18, 1998 (JP) .................................................. 10-088300
Jan. 25, 1999 (JP) .................................................. 11-015170

(51) Int. Cl.$^7$ ........................................................ G03F 9/00
(52) U.S. Cl. .................................................. 430/5; 430/30
(58) Field of Search ........................................... 430/5, 30

(56) References Cited

U.S. PATENT DOCUMENTS 5,858,591 * 1/1999 Lin et al. ................................ 430/30
6,040,892 * 3/2000 Pierrat ....................................... 430/5

* cited by examiner

Primary Examiner—Christopher G. Young
(74) Attorney, Agent, or Firm—Klarquist, Sparkman, Campbell, Leigh & Whinston, LLP

(57) ABSTRACT

Methods are disclosed for making reticles for charged-particle-beam (CPB) microlithography and for using such reticle for making CPB microlithographic exposures using divided-pattern exposure. The reticles are made using data, generated from corresponding LSI design data by a "data generator" (e.g., computer), and stored as a reticle-pattern data file in a memory. Corresponding data for controlling a CPB microlithographic exposure apparatus (using the reticle) are stored in an exposure data file. Of the data stored in these files, the reticle-pattern data is routed to a host computer for a reticle-writing device. The reticle writing device produces a pattern on a segmented reticle according to the data. Exposure data corresponding to the reticle-pattern data are routed to a host computer of a CPB microlithographic exposure apparatus. The host computer of the CPB exposure apparatus utilizes the data to drive the CPB exposure apparatus to perform transfer of the pattern from the reticle to the substrate.

12 Claims, 3 Drawing Sheets

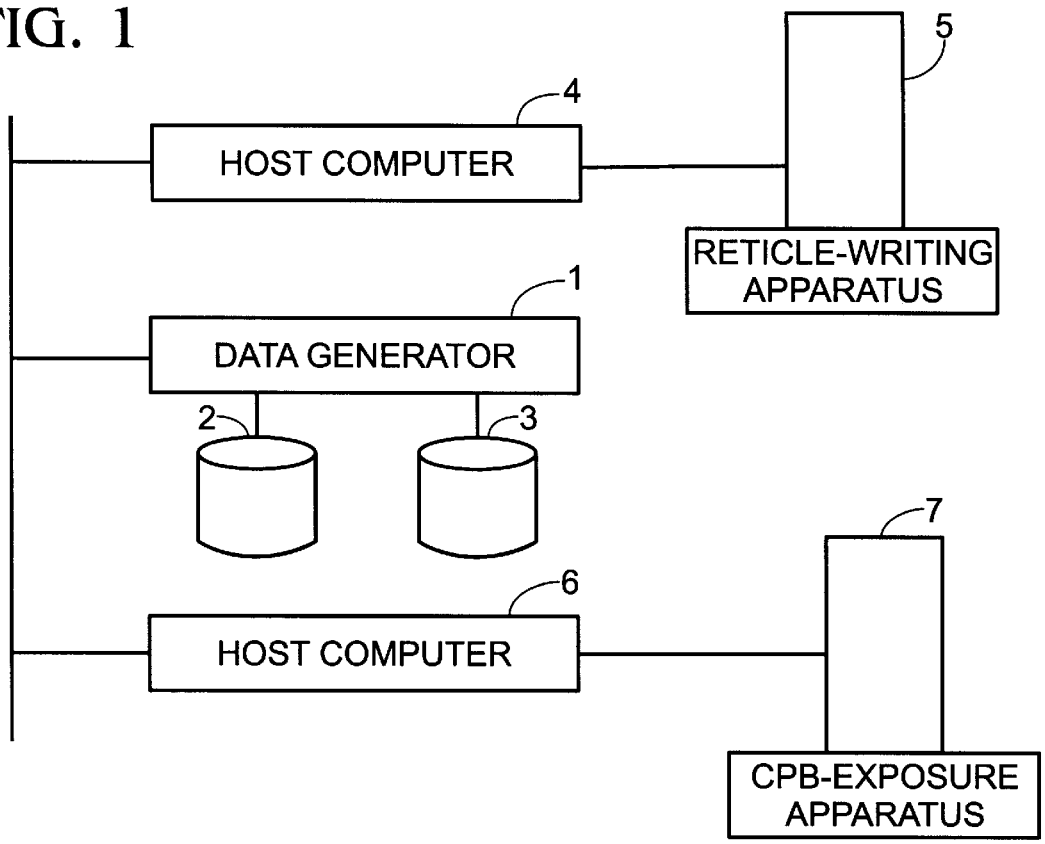
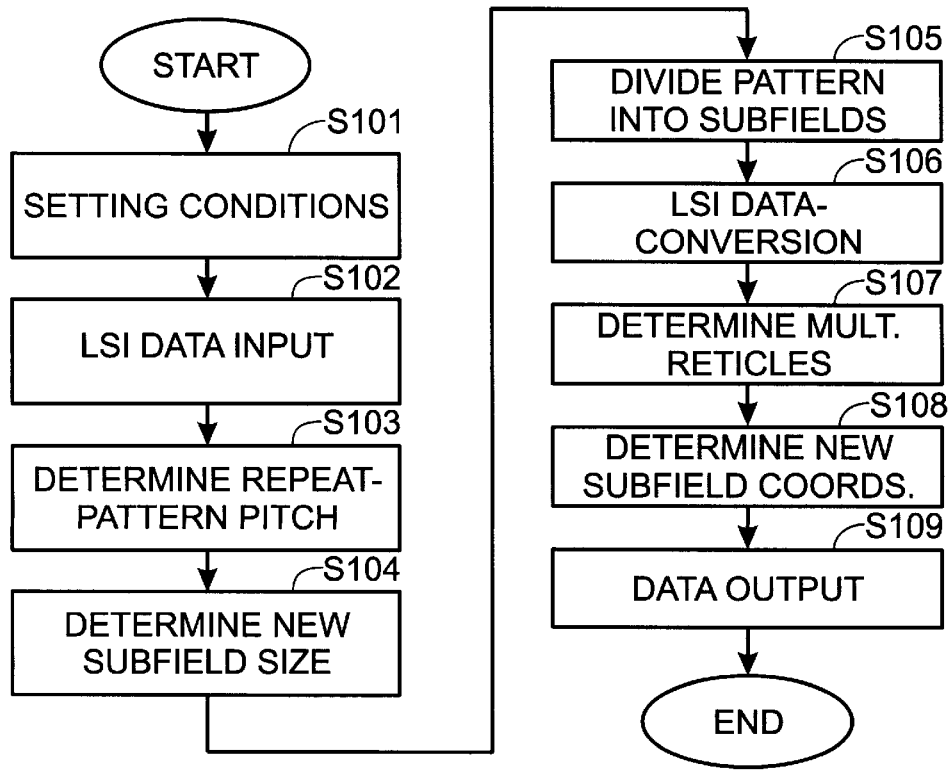

METHODS FOR PRODUCING SEGMENTED RETICLES

FIELD OF THE INVENTION

This invention pertains to microlithography using a charged particle beam (e.g., electron beam). More specifically, the invention pertains to segmented reticles and masks (generally termed herein "reticles") for such microlithography, to methods for making such reticles, and to methods for using such a reticle for making a microlithographic exposure.

Background of the Invention

Conventional methods for performing microlithography using a charged particle beam are essentially categorized into the three following methods: (1) "spot beam drawing", (2) "variable-shaped beam exposure", and (3) "cell-projection exposure." Compared with single-shot offset projection-exposure methods using conventional light, the charged-particle-beam (CPB) exposure methods listed above offer tantalizing prospects of vastly improved resolution but tend to exhibit disappointingly very low throughput. In particular, exposure methods (1) and (2) involve tracing the pattern feature-by-feature using an electron beam having an extremely small spot diameter or square-shaped transverse profile; consequently, throughput is extremely low with these methods. Exposure method (3), the "cell-projection exposure" method, was developed in an effort to improve throughput. In method (3), the reticle defines one or more portions of a die pattern. Typically, each portion is repeated multiple times in the overall pattern, and each portion is defined by a respective "cell" on the reticle. For example, a cell as projected onto the substrate measures 5 micrometers by 5 micrometers, and the same cell can be projected many times on the substrate (each projection of the cell being at a different respective location on the substrate) to form a complete die. Throughput is improved by performing a single-shot projection-exposure of each cell rather than exposing the pattern feature-by-feature.

Unfortunately, the "cell-projection exposure" method has limited applicability. Typically, a reticle defining a pattern in which a certain pattern portion is repeated a large number of times (e.g., memory cells) is most amenable to cell-projection exposure. Portions of such a pattern that appear only once (and virtually every pattern has such portions) cannot be exposed using cell-projection exposure (and hence are usually not defined on the reticle). To accommodate the need to expose such uniquely configured portions along with the highly repeated portions of the pattern, cell-projection exposure must be combined with another exposure method, typically the "variable-shaped beam exposure" method. Having to combine methods in this manner is a key reason why cell-projection exposure generally does not produce a throughput that is improved as much as might be expected or desired.

In order to further improve the throughput of conventional CPB microlithography methods, "divided-pattern exposure" apparatus and methods have been devised that currently are the subject of intensive development. In such apparatus and methods, the reticle is divided (typically into "fields" and "subfields") and only a portion of the reticle pattern (e.g., a subfield) is projected onto the substrate per "shot" at any one instant. For example, in FIG. 3, the substrate is depicted as a semiconductor wafer. Typically, the substrate is exposed with multiple dies (each destined to become a separate "chip"). Each die comprises multiple "stripes" and each stripe comprises multiple subfields. The corresponding reticle is "segmented" by which is meant that the reticle is divided into corresponding stripes and subfields.

Divided-pattern exposure apparatus normally perform exposures in a manner as shown generally in FIG. 4. The substrate and reticle are mounted on respective stages. The wafer stage and the reticle stage move at respective fixed velocities in opposite directions to each other. The relative velocities of the stages conform roughly to the demagnification ratio of the microlithography apparatus. The charged particle beam illuminates the subfields on the reticle individually and in an ordered manner (e.g., sequentially). The charged particle beam passing through the illuminated subfield forms an image of the illuminated subfield on a corresponding subfield on the substrate surface. Progression of the charged particle beam from one subfield on the reticle to the next is typically performed by sweeping the beam at right angles to the scanning motion of the stages.

With divided-projection exposure, the subfields are arranged in sequential order on the reticle and each subfield is exposed in one pass and with one respective "shot" of the beam. Therefore, divided-pattern exposure apparatus can exhibit a greatly improved throughput (compared to conventional CPB exposure apparatus).

Unlike a reticle used in optical microlithography, the reticle used for divided-pattern exposure is divided ("segmented") into subregions (e.g., subfields) each defining a respective portion of the overall pattern defined by the reticle. The subregions are separated from one another by peripheral struts. The struts provide mechanical strength to the reticle and help ensure that each reticle is illuminated separately from its neighbors by the charged particle beam.

A segmented reticle can be of a "stencil" type. However, stencil reticles pose problems for features having, e.g., doughnut-shaped profiles. If a stencil reticle is required and the pattern includes such features, a single reticle usually cannot be used to project the entire pattern and two "complementary reticles" are used instead. Each complementary reticle is exposed separately, and subfields containing doughnut features are exposed twice, once with each complementary reticle. I.e., the respective pattern portion defined by each subfield is divided between the two complementary reticles and two separate exposures are performed for each subfield to achieve a complete transfer of each subfield.

Respective examples of complementary reticles are shown in FIG. 5(a) and FIG. 5(b). In FIG. 5(a), two immediately adjacent stripes form a complementary pair of stripes; in FIG. 5(b), two immediately adjacent subfields form a complementary pair.

Therefore, if a single reticle is insufficient for covering an entire pattern for a die, multiple reticles can be used. In any event, during transfer of the pattern from each reticle to the substrate, the subfields are projected onto the substrate in respective locations that effectively "stitch" the subfields together on the substrate surface to form the complete pattern on each die.

Because the divided-pattern exposure method may require use of complementary reticles, conventional data-conversion methods cannot be used. Therefore, there is a need for data-conversion methods for use with divided-pattern exposure methods including exposure of complementary reticles.

SUMMARY OF THE INVENTION

This invention was developed in response to the situation summarized above. An object of the invention is to provide methods for generating data for use in forming a reticle, defining an LSI pattern, useful for performing a microlithographic exposure of the LSI pattern onto a substrate using a divided-pattern exposure method. Another object is to provide such methods that can be performed at a suitably high speed.

According to a first aspect of the invention, a representative such method comprises the following steps: From LSI design data concerning the particular pattern to be transferred to the substrate, data are generated that are useful for producing a segmented reticle defining the pattern as divided into multiple subfields, and for making a microlithographic exposure using the segmented reticle. The generated data are supplied to a reticle-writing apparatus to produce the segmented reticle. Also, the generated data are supplied to a microlithographic exposure apparatus for making a microlithographic exposure of the pattern, defined by the segmented reticle, onto the substrate. The microlithographic exposure is typically performed using a charged particle beam. The generated data can pertain to, inter alia, splitting the reticle into multiple reticles (such as complementary reticles) that collectively define the pattern.

In generating the data, a pattern-feature pitch of the pattern can be recognized, and a subfield size based on the pitch can be determined. Whenever the pattern pertains to a regular array of features as found, e.g., in memory chips, the pitch is automatically determined and the subfield size is readily determined based on that pitch. Thus, multiple identical subfields can be formed. After a single calculation, the data can be re-applied directly to other subfields without recalculation, which substantially reduces data generation and processing time.

According to another aspect of the invention, methods are provided for generating data for use in performing a microlithographic exposure of a pattern onto a substrate. According to a representative embodiment of such a method, data are provided concerning an LSI pattern to be defined by the reticle. From such data, a repeat-pattern pitch for the LSI pattern is calculated. From the repeat-pattern pitch and from data concerning a substrate to be exposed with the LSI pattern and concerning general aspects of a reticle that can be used to define the LSI pattern for such exposure, an optimum reticle-subfield size for the calculated pattern pitch is determined. The LSI pattern is then divided into multiple reticle subfields according to the optimum reticle-subfield size. A correction can be imparted as required to each of the subfields, as summarized below. Based on data obtained in preceding steps, the LSI pattern data are converted into subfields each defining a respective portion of the LSI pattern. Coordinates for each subfield defined in the preceding step are then determined. Based on data produced in the preceding steps, a reticle is formed. The reticle is used to expose the substrate with the pattern defined by the reticle.

The "correction" noted above can be one or more of: (1) correcting proximity effects, (2) dividing features between complementary reticles, (3) changing magnification of an entire reticle as projected, including feature pitch and feature size, (4) reticle-feature resizing, (5) eliminating multiple exposures, (6) reversing tone, (7) subfield-overlap processing, and (8) predistortion processing.

A correction imparted to a subfield in a pattern defining an $N^{th}$ LSI layer on the substrate can be based on a pattern applied in an $(N-1)^{th}$ LSI layer on the substrate. For example, the optimum amount of proximity effect correction of the Nth layer can be highly dependent on the structure of the $(N-1)^{th}$ layer.

The predistortion process can anticipate an optical-system distortion appearing at time of exposure and can include distorting reticle exposure data before making the exposure. The predistortion processing can comprise altering a characteristic of a subfield based on an anticipated manufacturing stress distortion of the reticle so as to cancel the manufacturing stress distortion. This method can also include (1) assessing, from the LSI pattern, whether a complementary reticle is required, and, if a complementary reticle is required, creating a complementary reticle pattern; and/or (2) assessing, from the LSI pattern, whether to split the LSI pattern into multiple reticles. The latter assessment is preferably made based on one or both of reticle size and substrate size. If multiple reticles are required, the LSI pattern can be split into groups of reticle-pattern data respectively corresponding to the multiple reticles.

The foregoing methods typically involve the generation and processing of large amounts of data. Nevertheless, the generation and processing of the data can be performed automatically and at high speed.

The foregoing and additional features and advantages of the present invention will be more readily apparent from the following detailed description, which proceeds with reference to the accompanying drawings.

Brief Description of the Drawings

FIG. 1 depicts an exemplary system for implementing any of various embodiments of the invention.

FIG. 2 is a flow chart of an exemplary embodiment of the invention.

DETAILED DESCRIPTION

Figure 3:
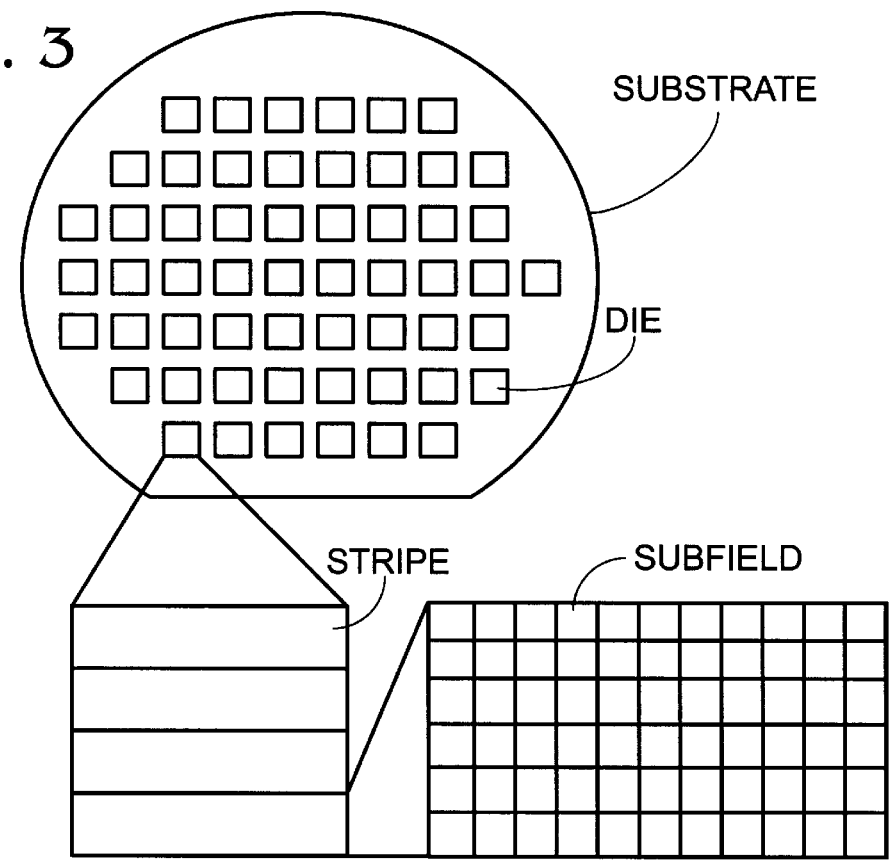
FIG. 3 depicts a general layout of dies, stripes, and subfields on the substrate (e.g., wafer) surface.
Figure 4:
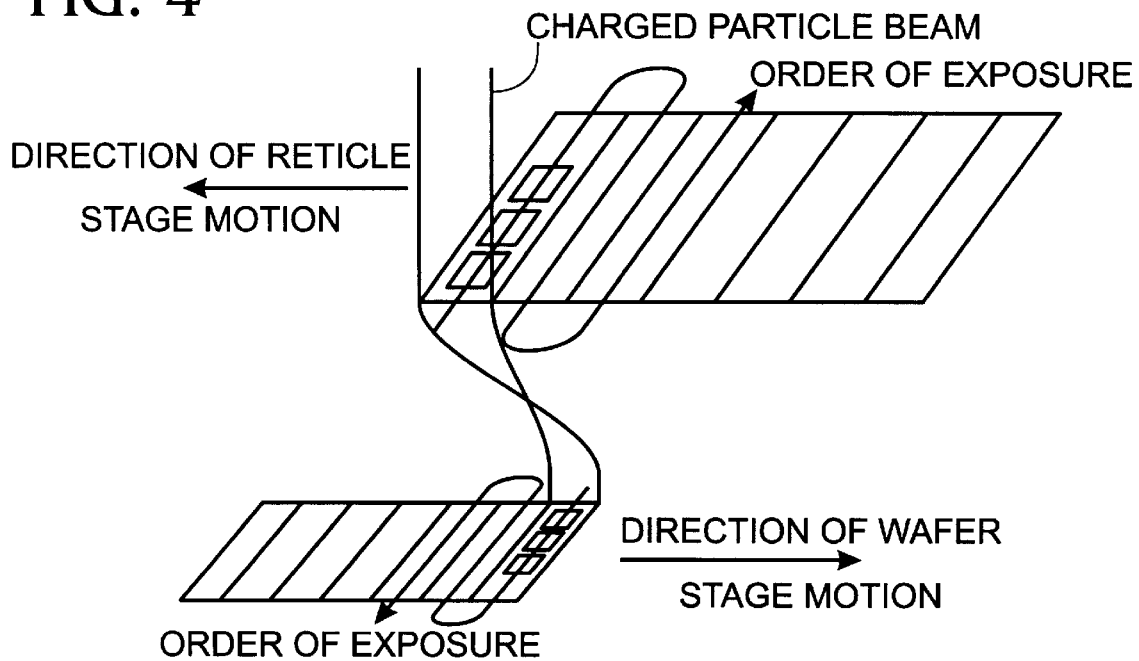
FIG. 4 schematically depicts a divided-pattern exposure method.

Reference is first made to FIG. 1 providing a system diagram of an exemplary system for implementing any of various embodiments of the present invention. The FIG.-1 system includes a "data generator" 1. The data generator 1 can be, for example, a computer with a memory (e.g., hard disk, RAM, or ROM). The FIG.-1 system also includes a reticle-pattern data file 2 preferably stored in the memory of the data generator 1, an exposure data file 3 (preferably stored in the same manner as the data file 2), a host computer 4 for a reticle-forming ("reticle-writing") apparatus 5, and a host computer 6 for a CPB-exposure apparatus 7. Data pertaining to the reticle pattern can be obtained from the particular layer of a particular LSI circuit that the reticle is intended to define.

The data generator 1, the host computer 4, and the host computer 6 are preferably connected in a network manner. Reticle pattern data produced by the data generator 1 are stored in the reticle-pattern data file 2, and data pertaining to exposure of the reticle onto a suitable substrate by the CPB-exposure device are stored in the exposure data file 3. The data generator 1 produces the respective data as described below in relation to FIG. 2.

Data stored in the reticle-pattern data file 2 are routed to the host computer 4 for the reticle-writing apparatus 5. The host computer 4 processes the data and utilizes the processed data to drive the reticle-writing apparatus 5 so as to create a corresponding pattern on a reticle. Exposure data is routed to the host computer 6 for the CPB-exposure apparatus 7. The host computer 6 processes the exposure data and utilizes the processed data to drive the CPB-exposure apparatus 7 in a manner facilitating transfer of the reticle pattern to the substrate.

Figure 5A:
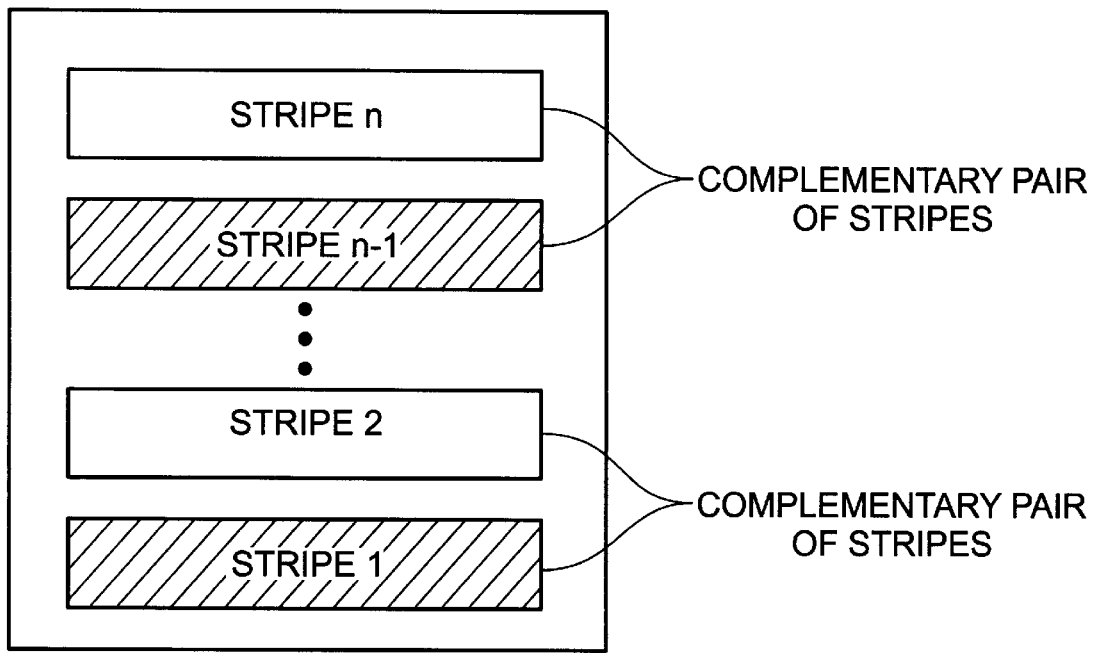
FIG. 5 depicts a representative layout of complementary reticles.
Figure 5B:
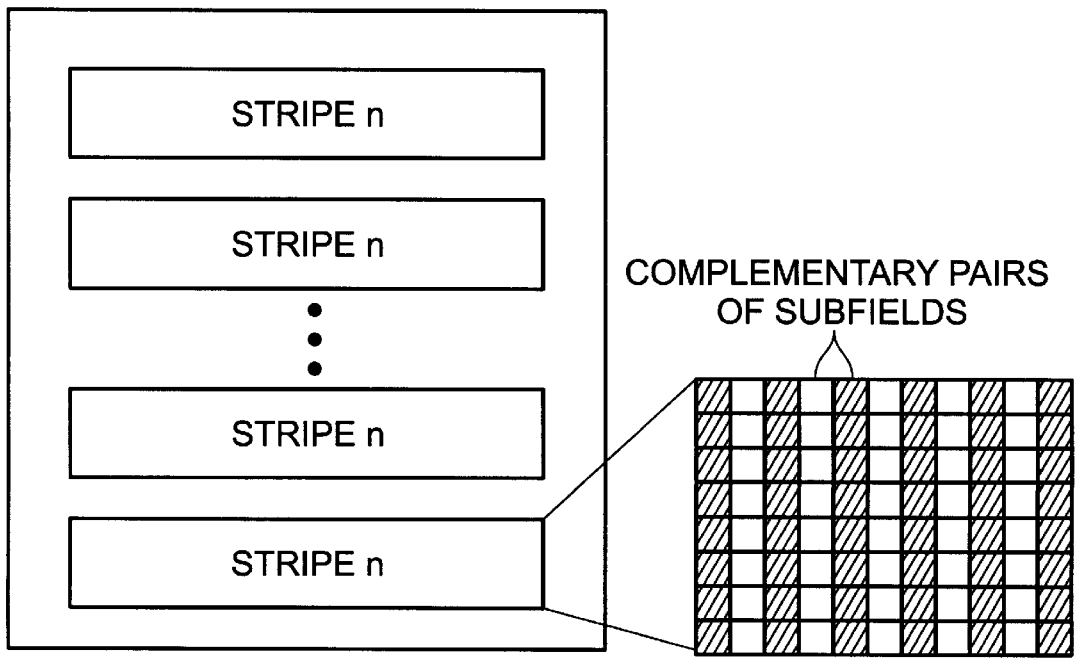

A detailed flow chart for the operation of the data generator 1 is described below and depicted in FIG. 2. The steps shown in FIG. 2 are as follows:

In step S101 ("setting conditions") certain fundamental conditions are set. To such end, data is input to the data generator 1 concerning certain general aspects of the reticle and the intended substrate (wafer) to be exposed. Such data include chip (die) size on the substrate; the range of reticle sizes that can be used; and permissible ranges of stripe size, subfield size, strut size, and distance between stripes, etc. The data can be input using an appropriate input device such as a keyboard, mouse, magnetic tape reader, magnetic disk reader, digital compact disk reader, etc. The data also can include whether a complementary reticle may be required, such as shown in FIGS. 5(a) and 5(b).

In step S102 ("LSI data input") the LSI design data for the desired pattern to be defined by the reticle are read-in in a conventional manner, such as by a network data-transfer system (e.g., a local-area network or "LAN") or by magnetic tape. During this step, LSI design data for the pattern created by, e.g., a CAD system is read-in to the data generator 1.

In step S103 ("determination of repeat pattern pitch") the pattern pitch is calculated by the data generator 1. For example, LSI design data for the pattern of a typical contemporary DRAM chip define a large number of repeated features. In this step, the repeat pitch of such a pattern is calculated from the LSI design data read-in in step S102.

In step S104 ("determining new subfield size") a determination is made of an appropriate size for the reticle subfields based on the pattern pitch determined in step S103, and the available range of subfield sizes and other data entered in step S101. If the same pattern portion is defined in each subfield, then the same calculation made for one subfield can be applied to each of the other subfields, thereby reducing the number of calculations that must be performed. For example, if a subfield dimension determined in step S104 is (m)(r), wherein "m" is an integer and "r" is the repeat-pattern pitch determined in step S1 03, the calculation need be performed for only one subfield, and applied to all other similar subfields, thereby reducing the time necessary to perform such calculations. For example, an integral multiple of the pattern pitch calculated in step S103 that is within the desired range of subfield sizes input in step S101 can be designated as the optimal subfield size.

In step S105 ("dividing the pattern into subfields") the data generator 1 divides the reticle pattern into subfields of the size determined in step S104. The data generator 1 then stores such data in its memory. More specifically, in step S105, the appropriate distribution of the pattern among subfields is made. (It is not necessary that all of the subfields be of the same size and shape.) During division of the reticle pattern into subfields, consideration is given to certain features, such as gates and minimum-linewidth features, that should not be divided among multiple subfields because a corresponding greater degree of accuracy would be required to stitch together such subfields when projected on the substrate. (General data regarding features that should not be divided are input during step S101.) Because, in step S105, certain features such as gates and minimum linewidths are regarded as indivisible features wherever possible, the exposure accuracy required for subfield stitching is reduced.

In step S106 ("LSI data conversion") the LSI design data (comprising data input in step S102 and data concerning the pattern distribution and corresponding divisions determined in step S105) are converted into data concerning the specific configurations of the pattern divisions defined in step S105. This conversion is performed and stored by the data generator 1 in its memory. Such data conversion can address any of various required tasks including, but not limited to, correction of proximity effects, dividing features between complementary reticles, adjusting the magnification of an entire reticle as projected (including feature pitch and feature size), reticle-feature "resizing," eliminating unwanted localized multiple exposures, reversing tone, subfield-overlap processing, and predistortion processing. "Resizing" refers to an adjustment of feature sizes based on data concerning expansion or shrinkage of features during manufacture of the reticle, without changing the pitch of the features on the reticle. For example, if during manufacture the reticle experiences a shrinkage of about 2 nm, the feature can be "resized" to be 2-nm larger than the final actual feature dimensions so as to cancel out the shrinkage. "Reversing tone" refers to whether a positive or a negative photoresist is being used, requiring a corresponding configuration of the reticle.

example of a feature that can be divided between two complementary reticles is a doughnut-shaped feature. Another example is a feature in which the localized density differs greatly from one location to another, which can lead to distortion and focus changes. To avoid problems with such features, the reticle pattern is divided. That is, certain reticle subfields are defined by respective portions of two separate complementary reticles.

In determining the specific manner in which proximity effects are corrected, consideration preferably is given to the pattern(s) exposed on the substrate prior to the present pattern, which can dictate a particular correction scheme for the present pattern that is different from a correction scheme that would otherwise be applied based solely on the present pattern. This is because, inter alia, secondary electrons propagating depthwise in the interior of the substrate behave differently depending upon the materials and previously transferred patterns through which the secondary electrons propagate. Hence, for example, where the layer requiring proximity-effect correction is the $N^{th}$ layer, the respective calculations are preferably made with reference to the LSI design data for the $(N-1)^{th}$ or earlier-deposited layer.

Two types of predistortion processing are of especial utility. The first is distortion correction, in which the LSI design data (in the divided condition effected by step S105) are manipulated to produce feature distortions that are opposite to corresponding distortions of the respective features exhibited by the projection-optical system. Whenever a reticle is made using reticle data created in this way and an exposure transfer is performed using such a reticle, the distortion of the projectionoptical system and the distortion of the features on the reticle cancel each other out and the pattern projected onto the substrate surface is free of distortion.

The second type of predistortion processing is especially applicable whenever the reticle is made of silicon. During production of a silicon reticle, mechanical stresses are imparted to the reticle. During conventional use of a silicon reticle for exposure transfer, the distribution of stress within the reticle can cause the reticle to exhibit distortion that makes it impossible to obtain accurate microlithographic results. Hence, a "correction" is imparted to the reticle data to produce exposure characteristics that exactly cancel the effects of the reticle distortion. Whenever a silicon reticle is created based on reticle data "corrected" in such a manner and used to perform a microlithographic exposure, a distortion-free pattern can be formed on the substrate, even when the reticle exhibits distortion caused by effects such as internal stress, or when distortion is caused by the electron-beam optical system used to project the reticle pattern onto the substrate. For periodic subfields (subfields each defining an identical pattern portion due to a matching of the subfield size to an integral multiple of the pattern repeat pitch), it is acceptable to perform localized corrective processing of a single subfield and apply the same processing results to the features in other subfields. However, if the features in the subfields are not part of a periodic overall pattern, corrective processing is preferably performed for each subfield.

In step S107 ("determination of multiple reticles") the LSI pattern data is processed and converted by the data generator 1 into data defining how, for example, stripes are to be distributed among multiple reticles (if multiple reticles are required). Also, in CPB-exposure apparatus employing the divided-pattern exposure method, the reticles that are used typically have reinforcing struts. The inclusion of struts can result in the reticle being large, with the reticle pattern being difficult to define on a single mask substrate. In such an instance, the reticle pattern can be defined on multiple reticles, and data conversion required to achieve such an end is performed in this step. Determining whether to use multiple reticles is based at least in part on factors such as those considered in step S101, e.g., reticle size, range of stripe size, range of strut size, and demagnification ratio of the CPB-exposure apparatus. Whenever the results of calculations performed in step S107 indicate a need to use a reticle that exceeds the permissible range of reticle sizes input in step S101, the reticle is divided into multiple reticles.

In step S108 ("determine new subfield coordinates") the data generator 1 determines the coordinates for each subfield on each reticle. New coordinates are determined at this stage because the coordinates of at least some of the subfields changed as a result of the execution of steps S101–S107. The new coordinates can be, for example, respective center coordinates of each subfield relative to a standard coordinate system for the reticle (reticle axes crossing in the center of the reticle). Alternatively or in addition, the new coordinates can be respective center coordinates of each subfield relative to a standard coordinate system for the respective stripe (stripe axes crossing in the center of the respective stripe). Determination of the new coordinates can also take into account data concerning the distance between adjacent stripes as well as strut sizes provided in step S101, or subfield sizes calculated in step S104. The data produced in this step are especially important for use by the CPB-exposure apparatus to ensure accurate subfield exposure and stitching.

In step S109 ("data output") data as generated in steps S101–S108 are output from the data generator 1 to the reticle-writing apparatus 5 and CPB-exposure apparatus 7 (FIG. 1). The data produced in steps S101–S108 typically correspond to a reconfigured reticle. The data are output to the reticle-writing apparatus 5 to produce the reconfigured reticle. Exemplary information needed by the reticle-writing apparatus 5 to produce the reconfigured reticle includes the new position coordinates of the pattern portions defined by respective subfields, taking into account the sizes of struts and stripes. A separate reticle data file is created by the data generator 1 for each reconfigured reticle and output to the reticle data file 2 for recall by the host computer 4 of the reticle-writing apparatus 5 as the reticle-writing apparatus 5 writes the reticle under the control of the host computer 4.

Also in this step, data are output from the data generator 1 to the CPB-exposure apparatus 7 (FIG. 1). Such data include coordinates of the desired location of each subfield to be imaged on the substrate surface from each respective subfield(s) on the reticle(s), as determined in step S108. The data are stored in the exposure-data file 3 for recall by the host computer 6 of the CPB-exposure apparatus 7 as the CPB-exposure apparatus 7 exposes the substrate(s) under the control of the host computer 6.

As can be ascertained from the foregoing description, the present invention makes it possible to automatically and easily produce data for a reticle-writing apparatus and for a CPB-exposure apparatus (destined to utilize the reticle produced by the reticle-writing apparatus) according to certain simple parametric data for divided-pattern exposure of the desired pattern. For example, subfield sizes are determined in accordance with the pitch of the design pattern. In any event, the number of calculations necessary to establish the content and locations of subfields configured according to the repeated features of the subject pattern is substantially reduced.

Whereas the invention has been described in connection with a representative embodiment, it will be apparent that the invention is not limited to those embodiments. On the contrary, the invention is intended to encompass all alternatives, modifications, and equivalents as may be included within the spirit and scope of the invention as defined by the appended claims.

What is claimed is:

1. A method for generating data for forming and using a reticle, the method comprising:
   (a) from LSI design data concerning a particular pattern to be transferred to a substrate, generating data useful for producing a segmented reticle defining the pattern as divided into multiple subfields, and for making a microlithographic exposure using the segmented reticle;
   (b) supplying the data generated in step (a) to a reticle-writing apparatus to produce the segmented reticle; and
   (c) supplying the data generated in step (a) to a microlithographic exposure apparatus for making a microlithographic exposure of the pattern, defined by the segmented reticle, onto the substrate.

2. The method of claim 1, wherein the microlithographic exposure is performed using a charged particle beam.

3. The method of claim 2, wherein step (a) further comprises generating data pertaining to splitting the reticle into multiple reticles that collectively define the pattern.

4. The method of claim 2, wherein the reticle is split into complementary reticles.

5. The method of claim 2, wherein step (a) further comprises recognizing a pattern-feature pitch of the pattern, and determining a subfield size based on the pitch.

6. A method for generating data for use in forming a reticle and for performing a microlithographic exposure of a pattern onto a substrate, the method comprising:
   (a) providing data concerning an LSI pattern to be defined by the reticle;
   (b) from the data provided in step (a), calculating a repeat-pattern pitch for the LSI pattern;
   (c) from the repeat-pattern pitch calculated in step (b) and from data concerning a substrate to be exposed with the LSI pattern and concerning general aspects of a reticle that can be used to define the LSI pattern for such exposure, determining an optimum reticle-subfield size for the calculated pattern pitch;

(d) dividing the LSI pattern into multiple reticle subfields according to the optimum reticle-subfield sizes determined in step (c);

(e) imparting a correction as required to data for at least one of the reticle subfields or at least one pattern feature;

(f) based on data from steps (a)–(e), generating reticle-writing-data for forming a segmented reticle in which the patterns of the multiple reticle subfields are defined;

(g) determining coordinates for each reticle-subfield on the reticle; and (h) based on data produced in the preceding steps, generating exposure data for performing a microlithographic exposure of a pattern defined by the reticle.

7. The method of claim 6, wherein step (e) comprises imparting a correction selected from the group consisting of correction of proximity effects, dividing features between complementary reticles, changing magnification of a reticle subfield, reticle feature resizing, eliminating multiple exposures, reversing tone, subfield-overlap processing, and predistortion processing.

8. The method of claim 6, wherein step (e) comprises imparting a correction to a reticle subfield or a pattern feature defined on the reticle at an $N^{th}$ LSI layer on the substrate based on a pattern applied in an $(N-1)^{th}$ LSI layer on the substrate.

9. The method of claim 7, wherein the predistortion process anticipates pattern-feature distortion due to an optical system that performs the microlithographic exposure and includes distorting reticle pattern-feature data.

10. The method of claim 7, wherein the predistortion processing comprises altering a characteristic of a reticle subfield based on an anticipated manufacturing stress distortion of the reticle so as to cancel the manufacturing stress distortion.

11. The method of claim 6, including the step of assessing, from the LSI pattern, whether a complementary reticle is required, and, if a complementary reticle is required, creating a complementary reticle pattern.

12. The method of claim 6, including the step of assessing, from the LSI pattern, whether to split the LSI pattern into multiple reticles, the assessment being made based on one or both of reticle size and substrate size, and, if multiple reticles are required, splitting and converting the LSI pattern into groups of reticle-pattern data respectively corresponding to the multiple reticles.

* * * * *

UNITED STATES PATENT AND TRADEMARK OFFICE
CERTIFICATE OF CORRECTION

PATENT NO. : 6,200,710 B1
DATED : March 13, 2001
INVENTOR(S) : Kazunari Hada

It is certified that error appears in the above-identified patent and that said Letters Patent is hereby corrected as shown below:

<u>Column 5,</u>
Line 44, "S1 03" should be changed to -- S103 --.

<u>Column 6,</u>
Line 25, "example" should be changed to -- An example --.
Line 55, "projectionoptical" should be changed to -- projection-optical --.

Signed and Sealed this

Twenty-second Day of January, 2002

Attest:

JAMES E. ROGAN
*Attesting Officer*     *Director of the United States Patent and Trademark Office*